United States Patent
Kirby et al.

(10) Patent No.: US 7,642,126 B2
(45) Date of Patent: Jan. 5, 2010

(54) METHOD OF MANUFACTURING CIRCUITS

(75) Inventors: Neil Kirby, Newport (GB); John Jefferies, Newport (GB)

(73) Assignee: Poly-Flex Circuits Limited, Newport, Isle of Wight (GB)

( * ) Notice: Subject to any disclaimer, the term of this patent is extended or adjusted under 35 U.S.C. 154(b) by 604 days.

(21) Appl. No.: 10/491,608

(22) PCT Filed: Sep. 30, 2002

(86) PCT No.: PCT/GB02/04397

§ 371 (c)(1),
(2), (4) Date: Dec. 16, 2004

(87) PCT Pub. No.: WO03/030248

PCT Pub. Date: Apr. 10, 2003

(65) Prior Publication Data

US 2005/0121421 A1 Jun. 9, 2005

(30) Foreign Application Priority Data

Oct. 2, 2001 (GB) ................... 0123676.9

(51) Int. Cl.
*B23K 26/20* (2006.01)
*B23K 26/18* (2006.01)
*H05K 3/32* (2006.01)

(52) U.S. Cl. .................. 438/106; 219/121.85

(58) Field of Classification Search .............. 219/121.6, 219/121.66, 121.64, 121.63, 121.82, 121.85; 156/272.8; 438/106, 108, 973, 457; 257/778; 439/65, 68, 69; 29/890.1, 841
See application file for complete search history.

(56) References Cited

U.S. PATENT DOCUMENTS

| | | | |
|---|---|---|---|
| 4,654,965 A | | 4/1987 | Uehara et al. |
| 4,694,138 A | * | 9/1987 | Oodaira et al. .......... 219/121.85 |
| 4,870,746 A | * | 10/1989 | Klaser .......... 29/620 |
| 4,928,384 A | * | 5/1990 | Gurevich .......... 29/623 |
| H1267 H | * | 12/1993 | Boyd .......... 257/666 |
| 5,481,082 A | | 1/1996 | Yamamoto |
| 5,538,586 A | * | 7/1996 | Swanson et al. .......... 156/309.6 |
| 5,763,296 A | * | 6/1998 | Casati et al. .......... 438/121 |
| 5,842,273 A | * | 12/1998 | Schar .......... 29/830 |
| 5,946,597 A | | 8/1999 | Miura et al. |
| 6,127,724 A | * | 10/2000 | DiStefano .......... 257/675 |
| 6,465,757 B1 | * | 10/2002 | Chen .......... 219/121.63 |
| 6,478,906 B1 | * | 11/2002 | Azdasht et al. .......... 156/73.1 |
| 6,555,783 B2 | * | 4/2003 | Koide .......... 219/121.73 |
| 6,752,954 B2 | * | 6/2004 | Ikeda et al. .......... 264/485 |
| 7,049,962 B2 | * | 5/2006 | Atherton et al. .......... 340/572.1 |
| 7,126,232 B2 | * | 10/2006 | Imahara et al. .......... 257/798 |
| 2001/0033179 A1 | * | 10/2001 | DiFrancesco .......... 324/757 |
| 2002/0102830 A1 | * | 8/2002 | Ishida .......... 438/604 |
| 2002/0137342 A1 | * | 9/2002 | Ishida et al. .......... 438/689 |

(Continued)

FOREIGN PATENT DOCUMENTS

EP 0 316 886 5/1989

(Continued)

*Primary Examiner*—Samuel M Heinrich
(74) *Attorney, Agent, or Firm*—Weingarten, Schurgin, Gagnebin & Lebovici LLP

(57) ABSTRACT

The method uses a laser beam directed through the substrate to the conductive area of the substrate in order to bond the two together.

19 Claims, 2 Drawing Sheets

U.S. PATENT DOCUMENTS

2002/0140096 A1 * 10/2002 Higgins, III ................ 257/737

FOREIGN PATENT DOCUMENTS

| | | | |
|---|---|---|---|
| EP | 0 807 912 | | 11/1997 |
| JP | 358007117 A | * | 1/1983 |
| JP | 401287846 A | * | 11/1989 |
| JP | 402168447 A | * | 6/1990 |
| JP | 406127106 A | * | 5/1994 |
| JP | 408242054 A | * | 9/1996 |
| JP | 02000309694 A | * | 11/2000 |
| WO | WO 96 25263 | | 8/1996 |

* cited by examiner

METHOD OF MANUFACTURING CIRCUITS

This application is a 371 national phase filing of PCT/GB02/04397 file Sep. 30, 2002, and claims priority to a British application No. 0123676.9 filed Oct. 2, 2001.

The present invention relates to a method of bonding an electrical component to substrate.

Integrated circuits are usually fabricated on a wafer, often of silicon, typically 150 mm in diameter, which can contain hundreds or thousands of individual die. The wafer is sawn along the edges of the die, so that they can be separated. Individual die tend to be too small and fragile for convenient direct electrical connection. For this reason, it is normal and within existing practice, for each die to be mounted on a more resilient, supporting substrate, which incorporates a larger contact area, or contact pins.

A brief summary of existing practices of bonding die to supporting substrates will now be described with reference to FIGS. 1 to 3. With regard to FIGS. 1 to 3, a die 2 includes a conductive layer 4. The die 2 has an outer insulating surface 6 which does not cover the entire conductive layer, thereby providing exposed contact areas 8. When the die 2 is mounted on a supporting substrate such that the exposed contact areas 8 face away from the supporting substrate, the conventional method of connection is by wire bonding to the contact areas 8.

An alternative connection method known as "Flip Chip" mounting is often used, in which the die 2 is mounted such that the exposed contact areas 8 face towards the supporting substrate 10. Where the flip-chip method is used, the contact areas 8 on the die 2 are deliberately increased in height or "bumped" (see 12 of FIG. 2). As can be seen in FIG. 3, the bumped contacts 12 connect and bond with conductive tracks 14 on the supporting substrate 10 via a conducting medium 16, such as solder, metal loaded adhesive, z-axis adhesive, when heat and/or pressure is applied.

Such methods of attachment are quite expensive because of the number of steps that are required, and the application of heat to melt the solder can cause distortion of the die 2 or of the substrate 10.

One aspect of the present invention provides a method of surface mounting an electrical component on a substrate, in which a contact area of the component is electrically connected to a conductive area on the substrate, the method comprising the steps of:
- positioning the component against the substrate in the position for mounting; and
- directing a laser beam through the substrate towards the contact area of the component such that the conductive area on the substrate facing the contact area absorbs energy from the laser beam and is thereby bonded to the contact conductive area, the substrate being arranged to be transmissive to the light and wherein the substrate is a plastics or polyester material.

The invention allows very low cost surface mounting to be achieved with low cost materials, and with minimal distortion of the substrate during bonding.

Any suitable laser may be used, but the use of a laser beam having a pulse time of the order of $10^{-15}$s is advantageous since heat deformation is minimal. Lasers having longer pulse times can be used where the substrate is less prone to heat distortion, or where tolerances allow for a little distortion. Clearly, the substrate must be transmissive to whatever laser beam is used.

The surface mounting method can require a substantial number of pulses of the laser beam to effect a bond.

The conductive tracks may be made from a material such as polymer thick film. Such a film can be a conductive ink, for example, a silver-loaded or carbon ink. Other types of conductive tracks can also be used, for example copper tracks deposited onto the substrate.

The electrical component may be a silicon die, or other electrical component such as a resistor, capacitor, diode, surface mount connector, liquid crystal display (LCD), or other electronic display component.

The electrical component may have one contact area, or a plurality of contact areas.

If lasers, are used, bumping of the die is not necessary because the conductive area on the substrate will move to make contact with the contact area. As such, the method reduces the costs of bonding the die and substrate as no bumping or wire bonding processes are required.

A second aspect of the invention provides a substrate having a conductive area, and an electrical component having a contact area, the component being arranged to be mounted on the substrate, wherein the substrate is a plastics or polyester material arranged to be transmissive to a laser beam which is directed through the substrate to the conductive area, and the conductive area is arranged to absorb energy from the laser beam to thereby bond the conductive area to the contact area.

The present invention also includes an electrical component mounted to a substrate using the above method.

One embodiment of the present invention will now be described, by way of example, with reference to the accompanying figures, in which.

Figure 1:
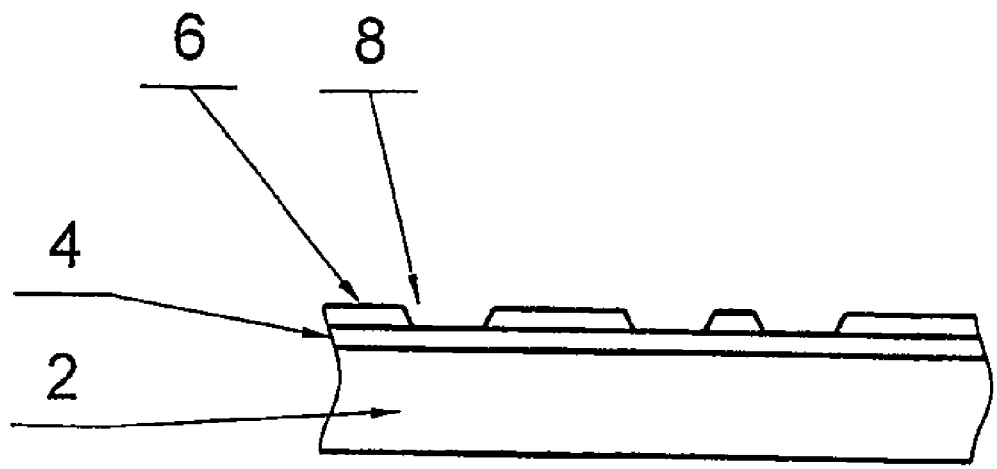
FIG. 1 illustrates a die.
Figure 2:
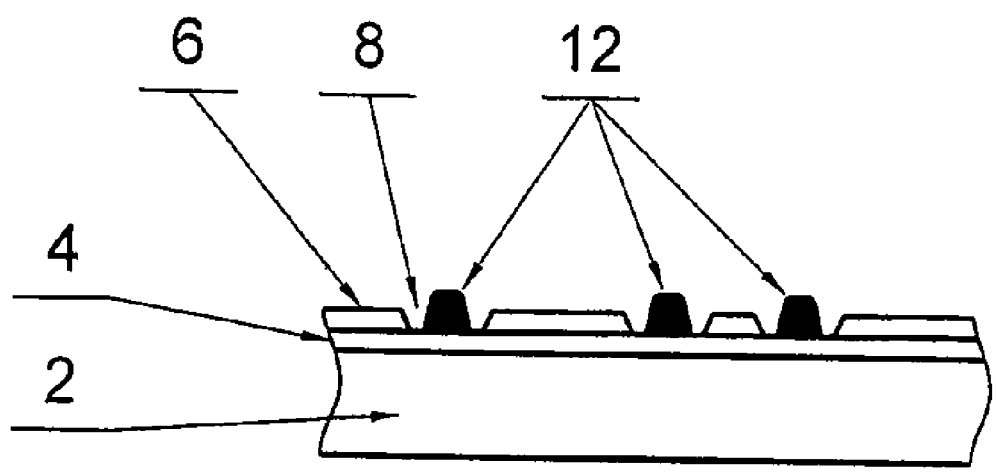
FIG. 2 illustrates a die that has been bumped.
Figure 3:
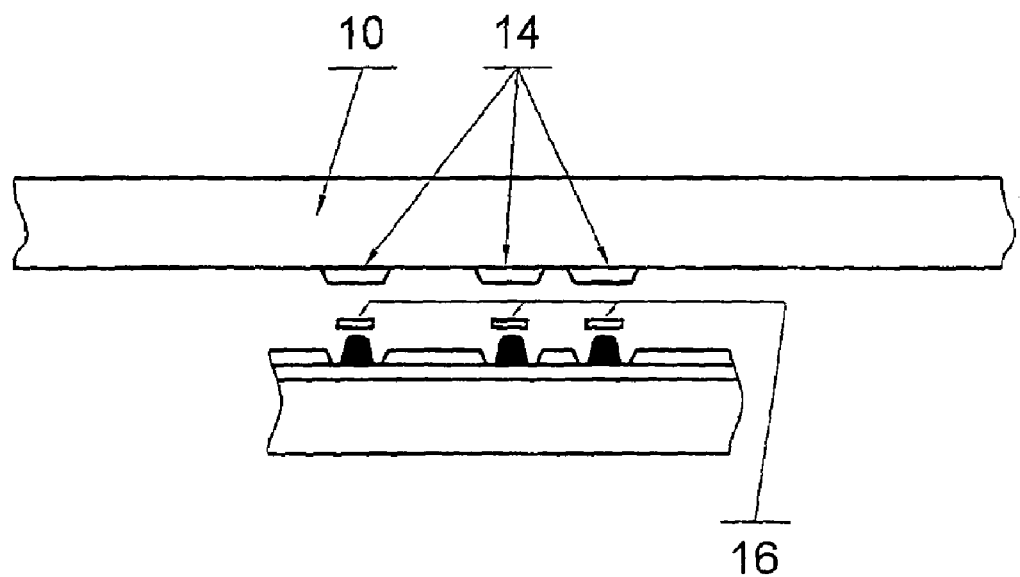
FIG. 3 illustrates a die and a substrate to be bonded together by a method in accordance with the prior art.

FIGS. 1 to 3 have been described in the introductory part of this application.

Figure 4:
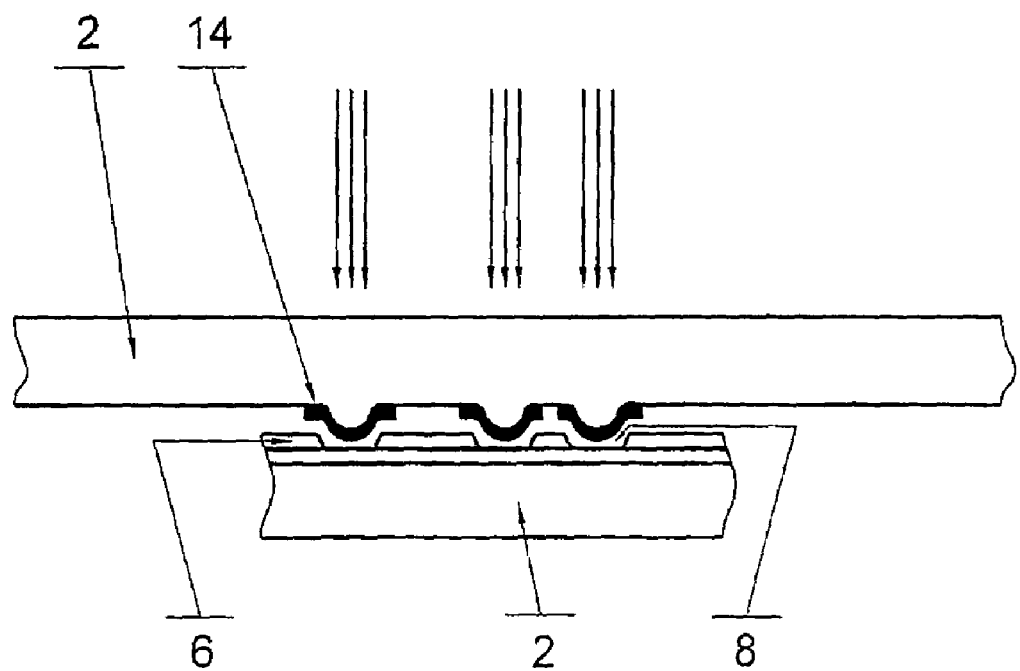
FIG. 4 illustrates a die and a substrate to be bonded together by a method in accordance with the present invention.

Referring to FIG. 4, a die 2 is shown, as described above with regard to FIG. 1. The die 2 has an outer insulating surface 6 which does not cover the entire conductive layer 4, thereby providing exposed contact areas 8.

The die 2 is positioned against a supporting substrate 10 in the "Flip Chip" arrangement as previously described, whereby the die 2 is positioned such that the exposed contact areas 8 face towards the supporting substrate 10. The substrate carries a plurality of conductive tracks 14.

A laser (not shown), which emits a laser beam of short pulse length, for example, a Fento-laser (shown by arrows in FIG. 4) is held over the substrate such that the laser beam is directed at the die 2 through the substrate 10. As well as being made from an insulative material, the substrate 10 is made from a material that is optically transmissive at the wavelength of the laser's beam so that a substantial proportion of the laser beam passes through it. Such material could be, for example, a plastics material such as polyester eg PET, one brand of which is Mylar®.

Furthermore, the conductive tracks 14 of the substrate 10 are made from a material which will absorb significant energy at the wavelength of the laser's emissions, such a material for example being polymer thick film (PTF), such as a conductive ink. Suitable conductive inks include silver-loaded or carbon inks. Such inks have a thickness in the range of between 3 μm and 50 μm, and most commonly between 8 μm and 10 μm.

The laser's emitted beam is directed through the transmissive substrate 10 towards the contact areas 8 on the die 2 whereupon the beams are absorbed by the conductive tracks 14. On absorption, the printed conductors 14 expand rapidly towards the die 2 so that they bond with the contact areas 8 of the die to form a conductive path. The expansion of the conductive tracks can be clearly seen in FIG. 4. Slight deformation of the area of the substrate 10 surrounding the conductive tracks 14 may be apparent, which aids the bonding process.

In order to necessitate bonding of the die 2 to the substrate 10, without causing entire melting of the substrate, an appropriate laser must be selected for that substrate material. Lasers with very short pulse lengths, such as Femto-lasers can be used. Such lasers emit pulses of the order of $10^{-15}$s in duration. Accordingly, the material does not melt, but rather the atoms unbond thereby causing it to create new bonds between the die 2 and the substrate 10. Femto-lasers have an advantage that, since the pulse length is so short, the tiny area on which the light is focused is heated, but the bulk of the material is not heated at all, thereby minimising distortion Heating is extremely localised.

Lasers having a longer pulse length can also be used, provided that the substrate is not distorted too much.

The life and reliability of flip-chip assemblies can be increased by the insertion of an adhesive between the die and the substrate, best described as under-fill. In some applications, under-fill may be used in the method according to this invention in order to increase the life and reliability of the overall assembly.

The present invention can be used in a large number of different ways. However, two examples of possible uses are now explained. Firstly, such a method is useful in the assembly of radio frequency identification (RFID) tags, particularly where a roll to roll assembly process is utilised for high volume processes, such as for contactless smart cards or airline baggage labels.

An alternative use is in the manufacture of a multi-chip module (MCM) where one or several die and sometimes other small discreet surface mount technology (SMT) components such as capacitors and resistors are assembled onto a small printed circuit board (PCB) or ceramic before final assembly into a standard SMT package. An example of such a package is a ball grid array (BGA), that can be assembled by standard SMT equipment. The laser assembly technique described here would reduce the cost of the MCM by replacing the PCB with a lower cost polyester substrate, eliminating the wire bond or flip-chip assembly process normally required in these modules.

There are two environmental advantages of the present invention as well, since the process eliminates the need for flip-chip die. Firstly, the chemical plating processes used to produce the bumps on flip-chip die are eliminated, and secondly, the use of solder and flux from the standard flip-chip assembly process is also eliminated.

The invention claimed is:

1. A method of surface mounting an unbumped die on a substrate, in which a recessed contact area of the die is electrically connected to a conductive area on the substrate, the method comprising the steps of:
    positioning the die against the substrate in a position for mounting such that the conductive area on the substrate is positioned facing, and spaced from, the corresponding contact area of the die; and
    directing a laser beam through the substrate towards the contact area of the die such that the conductive area on the substrate facing the contact area absorbs energy from the laser beam to expand towards and to bond and electrically connect with the contact area, the substrate being optically transmissive to the laser beam and wherein the substrate is a plastic or polyester material.

2. A method according to claim 1, wherein the laser beam has a pulse time of the order of $10^{-15}$s.

3. A method according to claim 1, wherein the laser beam has a pulse time of more than $10^{-15}$s.

4. A method according to claim 1, wherein a substantial number of pulses of the laser beam are used to effect a bond.

5. A method according to claim 1, wherein the conductive area on the substrate is a polymer thick film.

6. A method according to claim 5, wherein the polymer thick film is a conductive ink.

7. A method according to claim 6, wherein the conductive ink is one of a silver-loaded ink and a carbon ink.

8. A method according to claim 1, wherein the conductive area on the substrate is a metal track.

9. A method according to claim 1, wherein the die is a silicon die.

10. A method according to claim 1, wherein the die includes one or more contact areas.

11. A method according to claim 2, wherein a substantial number of pulses of the laser beam are used to effect a bond.

12. A method according to claim 3, wherein a substantial number of pulses of the laser beam are used to effect a bond.

13. A method according to claim 4, wherein:
    the conductive area on the substrate is a polymer thick film;
    the polymer thick film is a conductive ink; and
    the conductive ink is one of a silver-loaded ink and a carbon ink.

14. A method according to claim 11, wherein:
    the conductive area on the substrate is a polymer thick film;
    the polymer thick film is a conductive ink; and
    the conductive ink is one of a silver-loaded ink and a carbon ink.

15. A method according to claim 12, wherein:
    the conductive area on the substrate is a polymer thick film;
    the polymer thick film is a conductive ink; and
    the conductive ink is one of a silver-loaded ink and a carbon ink.

16. A method according to claim 4, wherein:
    the conductive area on the substrate is a metal track;
    the die is a silicon die; and
    the die includes one or more contact areas.

17. A method according to claim 11, wherein:
    the conductive area on the substrate is a metal track;
    the die is a silicon die; and
    the die includes one or more contact areas.

18. A method according to claim 12, wherein:
    the conductive area on the substrate is a metal track;
    the die is a silicon die; and
    the die includes one or more contact areas.

19. A method of surface mounting an unbumped die on a substrate, in which a recessed contact area of the die is electrically connected to a polymer thick film conductive area on the substrate, the method comprising the steps of:
    positioning the die against the substrate in the position for mounting such that the polymer thick film conductive area on the substrate is positioned facing, and spaced from, the corresponding recessed contact area of the die; and
    directing a laser beam through the substrate towards the contact area of the die such that the polymer thick film conductive area on the substrate facing the recessed contact area absorbs energy from the laser beam to expand towards and to bond and electrically connect with the contact area, the substrate being optically transmissive to the laser beam and wherein the substrate is a plastic or polyester material.

\* \* \* \* \*

UNITED STATES PATENT AND TRADEMARK OFFICE
CERTIFICATE OF CORRECTION

PATENT NO.        : 7,642,126 B2
APPLICATION NO.   : 10/491608
DATED             : January 5, 2010
INVENTOR(S)       : Kirby et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1013 days.

Signed and Sealed this

Sixteenth Day of November, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,642,126 B2 | |
| APPLICATION NO. | : 10/491608 | |
| DATED | : January 5, 2010 | |
| INVENTOR(S) | : Neil Kirby | |

It is certified that error appears in the above-identified patent and that said Letters Patent is hereby corrected as shown below:

Column 2, line 48, "Fento-laser" should read --Femto-laser--; and

Column 3, line 17, "distortion Heating" should read --distortion. Heating--.

Signed and Sealed this
First Day of February, 2011

David J. Kappos
*Director of the United States Patent and Trademark Office*